United States Patent
Ruby

(10) Patent No.: US 7,791,918 B2
(45) Date of Patent: Sep. 7, 2010

(54) STACK POSITION LOCATION IDENTIFICATION FOR MEMORY STACKED PACKAGES

(75) Inventor: Paul Ruby, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 11/862,802

(22) Filed: Sep. 27, 2007

(65) Prior Publication Data

US 2009/0084838 A1    Apr. 2, 2009

(51) Int. Cl.
*G11C 5/02* (2006.01)

(52) U.S. Cl. .................... 365/51; 257/686; 365/52; 365/230.03

(58) Field of Classification Search .............. 257/686; 365/51, 52, 230.03
See application file for complete search history.

(56) References Cited

U.S. PATENT DOCUMENTS

| | | | | |
|---|---|---|---|---|
| 4,398,248 | A * | 8/1983 | Hsia et al. | 365/230.03 |
| 5,479,638 | A * | 12/1995 | Assar et al. | 711/103 |
| 5,502,667 | A * | 3/1996 | Bertin et al. | 365/51 |
| 6,249,562 | B1 * | 6/2001 | Wells | 377/26 |
| 6,426,560 | B1 * | 7/2002 | Kawamura et al. | 257/777 |
| 7,123,497 | B2 * | 10/2006 | Matsui et al. | 365/51 |
| 2005/0082664 | A1 * | 4/2005 | Funaba et al. | 257/724 |
| 2006/0062072 | A1 * | 3/2006 | Cho | 365/230.03 |
| 2010/0027309 | A1 * | 2/2010 | Park | 365/63 |

* cited by examiner

*Primary Examiner*—Dang T Nguyen
*Assistant Examiner*—Alexander Sofocleous
(74) *Attorney, Agent, or Firm*—Cool Patent, P.C.; Joseph P. Curtin

(57) ABSTRACT

A method for use with devices in a stacked package is discussed. By preprogramming a unique identifier into a device during manufacture, the device can determine its position in the stack and perform a task based on its position in the stack. In one embodiment, the task is power-up.

15 Claims, 3 Drawing Sheets

STACK POSITION LOCATION IDENTIFICATION FOR MEMORY STACKED PACKAGES

BACKGROUND

Today's chip scale packages (CSP) have multiple memory devices stacked into a single package. The multiple memory devices may have different behavior that is unique to their position in the stack. Current methods proposed involve difficult detection schemes or require customer (user) intervention to initiate unique behavior for each device.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
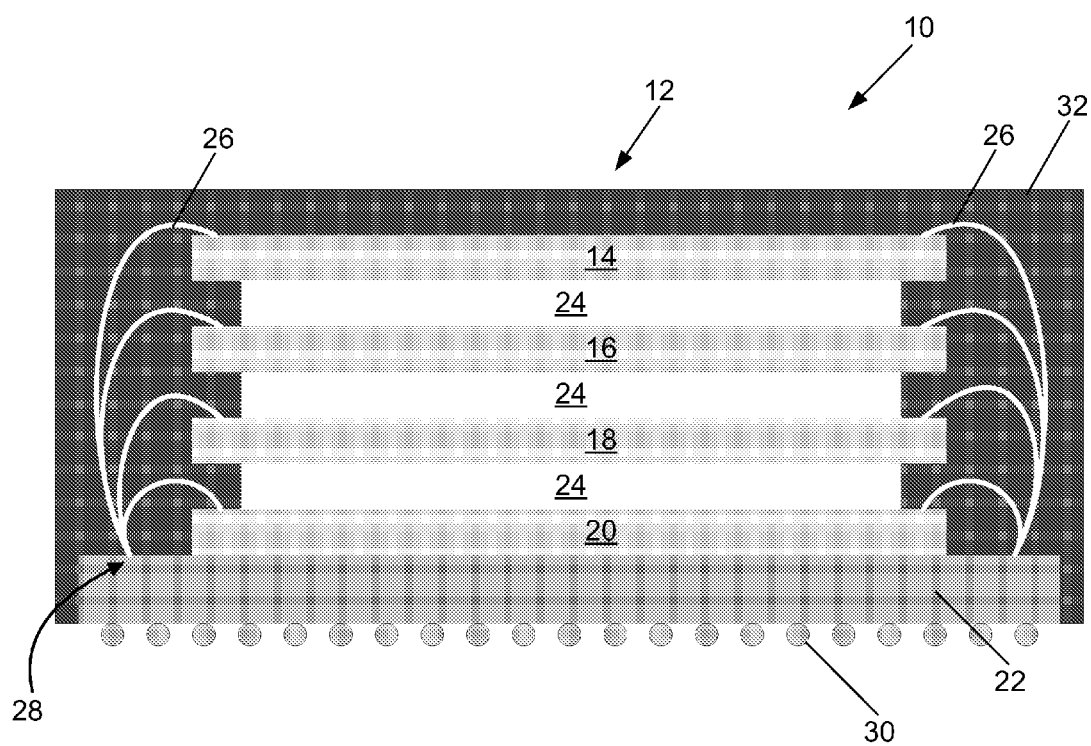
FIG. 1 is a cross-sectional view of a chip scale package (CSP).

Referring to FIG. 1, a cross-section of a chip scale package (CSP) according to one embodiment is shown at 10. CSP 10 includes a stack 12 of devices 14, 16, 18, and 20 on top of a substrate 22. The deuces in the stack are separated by spacers 24. CSP 10 further includes bond wires 26 for sharing signals between devices in the stack. The bond wires lead from one or more of the devices and connect at a common connection point 28 on the substrate. Solder balls 30 and/or underfill material couple the substrate 22 to an end user circuit board (not shown).

The CSP may include encapsulation 32 over the stack of devices, spacers, bond wires, and substrate. In one embodiment, the encapsulation is plastic, or alternatively, other suitable materials. The encapsulation may also be referred to as "package", and "device" also referred to as a "die" in this specification.

A stack (also herein referred to as "stacked package") may include two or more of these devices in a single package or individual packages vertically stacked. As shown, CSPs vertically stack individual die within a single package. Stacked thin small-outline packages (TSOPs) are individual packages vertically stacked that may also be used. The stack may include silicon devices such as flash, dynamic random access memory (DRAM), static random access memory (SRAM), application-specific integrated circuit (ASIC), multi-chip module (MCM), processor, and other devices.

Figure 2:
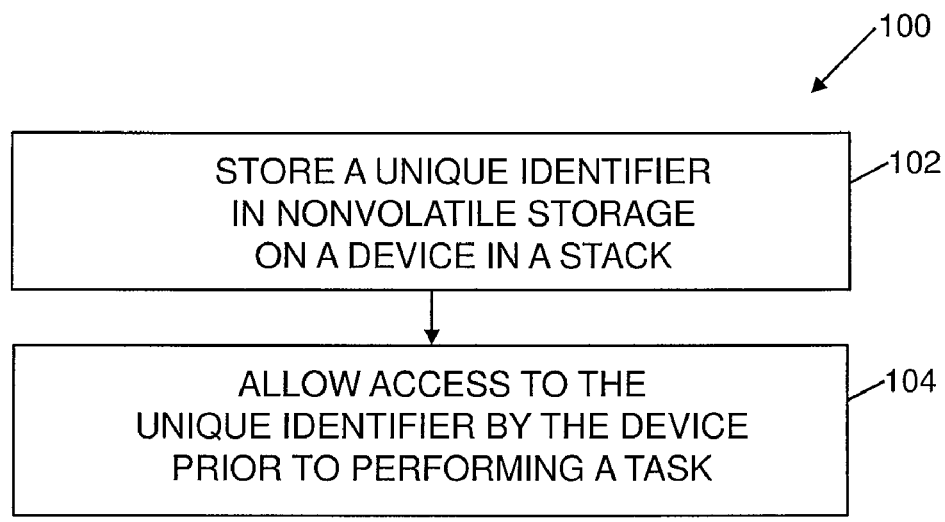
FIG. 2 is a flowchart according to one embodiment.

Turning to FIG. 2, in accordance with one embodiment, a method 100 provides these devices with additional information so that they may know their positions in the stack. A method of packaging a CSP includes, at 102, storing a unique identifier in nonvolatile storage on one or more devices in a stack. During device testing in the manufacturing flow, a unique identifier may be programmed into one or more devices in the stack. The unique identifier may be a number or other indicator associated with a stack position.

A unique identifier may be stored in content addressable memory (CAMs), fuses, bonding options, flash memory or any other form of programmable nonvolatile storage. This nonvolatile storage is readily available on most devices. For example, NAND and NOR memory devices use CAMs, memory that implement the lookup-table function in a single clock cycle using dedicated comparison circuitry.

Further, after preprogramming a unique identifier into a location on the device, method 100 allows access to the unique identifier by the device prior to performing a task at 104. The unique identifier provides the device with its position in the stack. The device itself can then access the unique identifier to make a determination on how to perform the task, as will be further discussed below. In one exemplary embodiment, once the device determines where it is in the stack, the device may decide a turn order, and thereby self-impose a delay before performing the task. It should be known that a task may include any behavior that may be tailored to a specific position in a stacked package.

Figure 3:
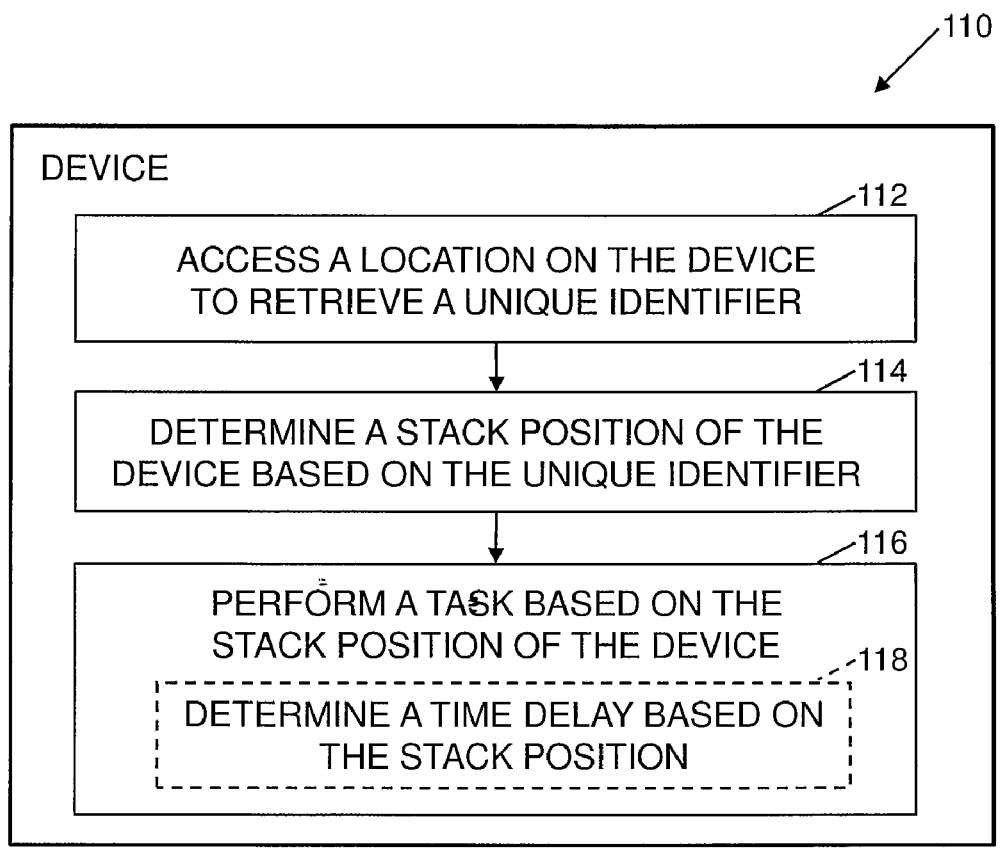
FIG. 3 is a flowchart according to one embodiment.

Referring to FIG. 3, in another aspect, a method for use in a chip scale package with a plurality of devices in a stack is shown at 110. As discussed before, a device may be programmed with a unique identifier at a location on the device. The method includes a step 112 of, at a device, accessing the location on the device to retrieve the preprogrammed unique identifier, and at 114, determining a stack position of the device based on the unique identifier.

Method 110 further includes, at step 116, performing a task based on the stack position of the device. Step 116 may include a sub-step of determining a time delay in performing the task based on the stack position at 118. To generalize, by knowing its position in the stack, the device may adjust its behavior to increase efficiency.

Figure 4:
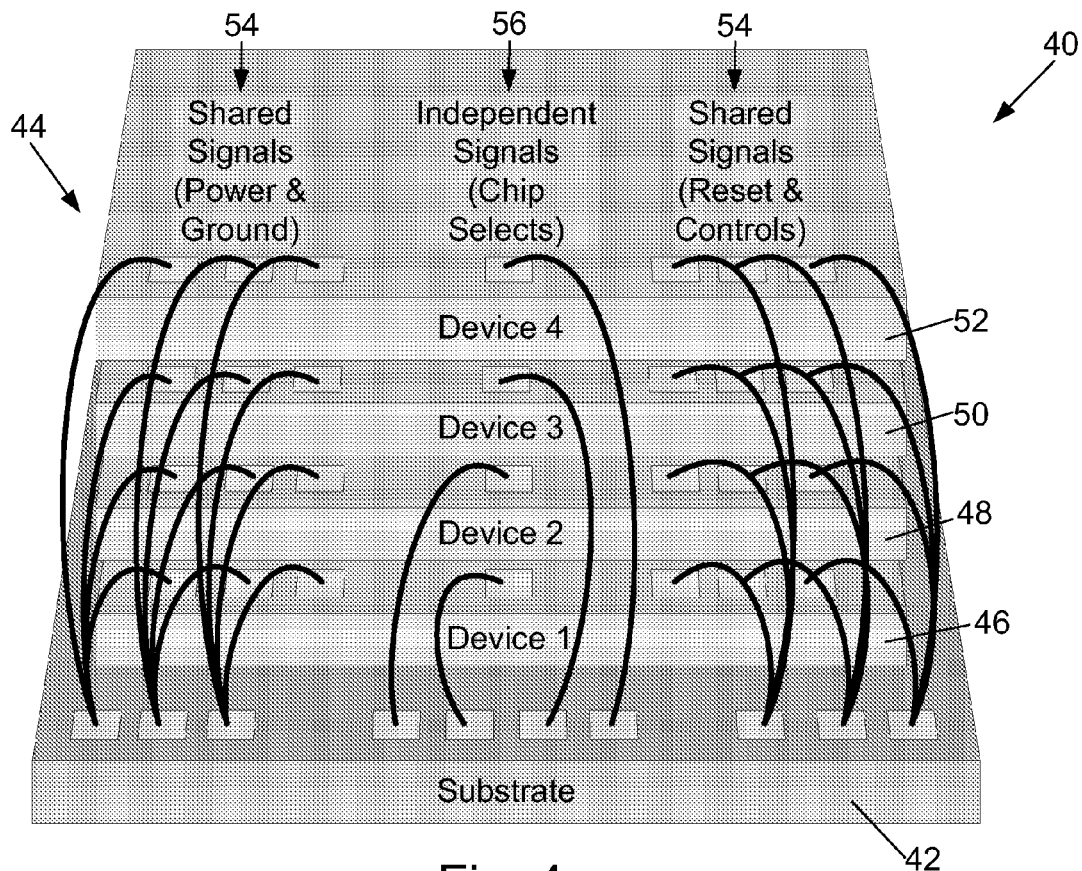
FIG. 4 is a side cross-sectional view of a CSP.

Turning to FIG. 4, a side cross-section of a typical CSP (shown without encapsulation) is illustrated at 40. The CSP includes a substrate 42 and a stack 44 of four semiconductor devices 46, 48, 50, and 52 mounted above the substrate. Most electrical signals (power, ground, reset, and other controls) 54 are shared among one or more devices. Independent signals (chip selects) 56 lead from one or more devices to the substrate independently.

During power up of a user system, the devices will see the same incoming signals: reset signals are active, chip selects are inactive, and power is applied. As such, the devices will launch into power-up reset activity at the same time. Because the devices draw power at the same time, this can cause a "brown-out" type situation inside the package or even outside the package in the rest of the user system if the power supply capability is weak. The devices do not know if there are other devices in the same package and have no way of determining any power up sequencing order between devices.

In accordance with one embodiment, the addition of a unique identifier in a device provides the device its position in the stack. Once the device has this information on-chip, then it can decide how to proceed. The on-chip microcontroller code (also referred to as "microcode") may use this information to delay its power-up sequence based on its stack position. In one embodiment, a plurality of devices are each preprogrammed with a unique identifier, and thus all of the devices know when they can power up.

Figure 5:
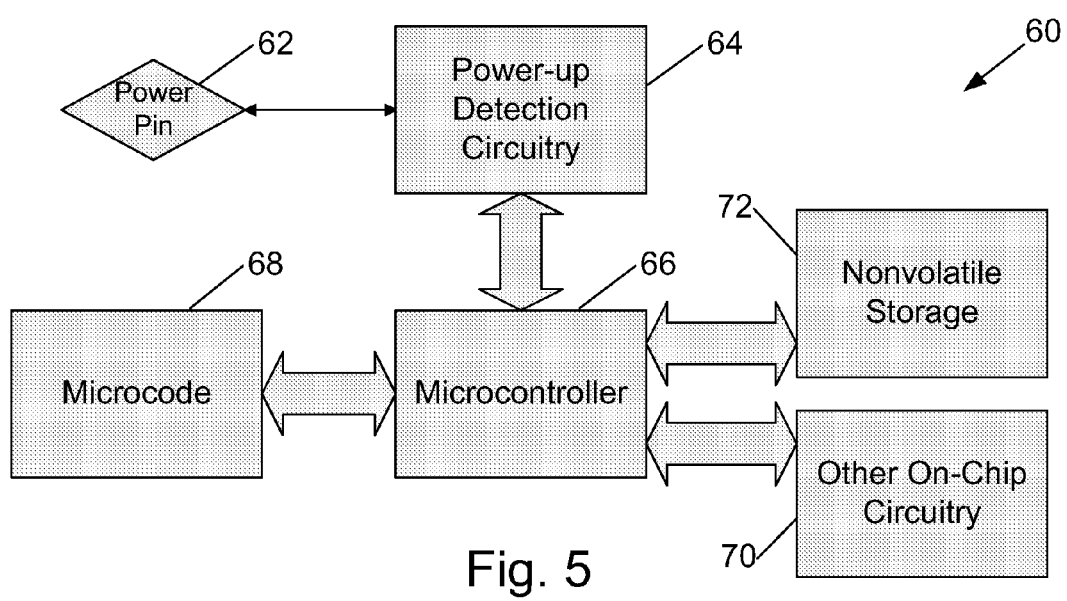
FIG. 5 shows relevant architecture inside a device during a power-up sequence according to one embodiment.

Referring to FIG. 5, relevant architecture inside a device (such as any of devices 46, 48, 50, and 52) during a power-up sequence according to one embodiment is shown at 60. The components in this architecture are typical of NAND flash, NOR flash, DRAM and other forms of memory. The following exemplary embodiment will aid in understanding the application of a unique identifier in a semiconductor device.

The device includes at least one power pin (usually Vcc) 62 which connects to a power-up detection circuit 64. When power is applied to the device, this circuit signals the microcontroller (or state machine) 66 that a new power-up has occurred. The microcontroller fetches and executes a power-up program 68. The program may include microcode containing instruction sequences for the microcontroller and/or other algorithms. Program 68 is used to initialize and configure all other on-chip circuitry 70, which requires a large amount of power for a short period of time. Initialization and configuration may take approximately 10 ms, but may be longer or shorter depending on the circuitry. Once the circuit configuration is complete, power consumption drops to very low levels.

As a part of the power-up program 68, the microcontroller retrieves unique information (such as a unique identifier) from the nonvolatile storage in order to determine stack position of the device. The program 68 makes a decision on how long to wait before executing high-power configuration activity.

In this exemplary embodiment, if stack position is equal to 0, the program instructs the on-chip circuitry to begin high-power configuration immediately. If stack position is equal to 1, wait for 10 ms in a low-power state, then begin high-power configuration. If stack position is equal to 2, wait for 20 ms in a low-power state, then begin high-power configuration. If stack position is equal to 3, wait for 30 ms in a low-power state, then begin high-power configuration. If stack position is equal to n, wait for n×10 ms in a low-power state, then begin high-power configuration. By staggering the high-power configurations, there may be reduced the risk of damage to the CSP, and increased efficiency in power-up.

After delaying for the appropriate time as determined by stack position, the microcontroller executes its high-power configuration operations, which last for about 10 ms. After this completes, the device returns to a low-power, stand-by state. It should be understood that the time delay may be shorter or longer than 10 ms, and may be dependent on the time it takes for high-power initialization and configuration.

Regarding FIGS. 1 and 4 above, each figure pictures 4 devices, however, it should be known that there may be more or less devices than depicted in the CSP. Further, these devices as labeled do not necessarily correspond with stack position.

It is appreciated that stack position location identification has been explained with reference to one general exemplary embodiment, and that the disclosed subject matter is not limited to the specific details given above. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the invention is not limited to the details described above. Rather, it is the following claims including any amendments thereto that define such scope and variations.

What is claimed is:

1. A method of packaging a chip scale package, the method comprising:
   storing a unique identifier in nonvolatile storage on an individual device in a vertical stack, the vertical stack comprising a plurality of individual devices arranged in a stacked with respect to a surface of a substrate, the unique identifier providing to the individual device a stack position of said individual device in the vertical stack with respect to other individual devices in the vertical stack and the surface of the substrate;
   allowing the individual device access to the unique identifier by said device prior to performing a task; and
   determining by the individual device a temporal turn order of the individual device based on the unique identifier for the individual device, the temporal turn order of the individual device being with respect to temporal turn orders of other individual devices in the vertical stack to perform the task.

2. The method according to claim 1, further comprising self imposing by the individual device a time delay in performing the task, the self-imposed time delay corresponding to unique identifier for the individual device.

3. The method of claim 2, further comprising:
   storing a second unique identifier in nonvolatile storage on a second individual device in the vertical stack, the second unique identifier providing to the second individual device a stack position of the second individual device with respect to other individual devices in the vertical stack;
   allowing the second individual device access to the second unique identifier prior to performing the task; and
   determining by the second individual device a temporal turn order of the second individual device based on the unique identifier for the second individual device, the temporal turn order of the second individual device being with respect to temporal turn orders of other individual devices in the vertical stack to perform the task.

4. The method of claim 3, wherein storing the unique identifier of an individual device comprises storing the unique identifier using content addressable memory located on the individual device.

5. The method of claim 3, wherein storing the unique identifier of an individual device comprises storing the unique identifier using fuses located on the individual device.

6. The method of claim 3, wherein storing the unique identifier of an individual device comprises storing the unique identifier using bonding options located on the individual device.

7. The method of claim 3, wherein storing the unique identifier of an individual device comprises storing the unique identifier using flash memory located on the individual device.

8. A method for use with a plurality of individual devices in a vertical stack of a chip scale package, the method comprising:
   at an individual device in the vertical stack,
   accessing a location on the individual device to retrieve a preprogrammed unique identifier, the preprogrammed unique identifier providing to the individual device a stack position of the individual device in the vertical stack with respect to other individual devices in the vertical stack and the surface of the substrate;

determining by the individual device a position of the individual device in the vertical stack based on the preprogrammed unique identifier accessed by the individual device; and performing a task by the individual device in a temporal turn order with respect to temporal turn orders of other individual devices in the vertical stack, the temporal turn order of the individual device being based on the stack position of the individual device, and the temporal turn orders of the other individual devices in the vertical stack being based on the respective positions of the other individual devices in the vertical stack.

9. The method of claim 8, further comprising self imposing by the individual device a self-imposed time delay for the individual device to perform the task, the self-imposed delay corresponding to unique identifier for the individual device.

10. The method of claim 9, further comprising, at a second individual device in the vertical stack, accessing by the second individual device a location on said second individual device to retrieve a second preprogrammed unique identifier;

determining by the second individual device a position of said second individual device in the vertical stack based on the second preprogrammed unique identifier accessed by the second individual device; and performing the task by the second individual device in a temporal turn order with respect to temporal turn orders of other individual devices in the vertical stack, the temporal turn order of the second individual device being based on the position of said second individual device in the stack.

11. The method of claim 10, further comprising performing the task at the individual device after the self-imposed time delay for the individual device, the task comprising powering up the individual device.

12. The method of claim 10, further comprising performing the task at the individual device after the self-imposed time delay for the individual device, the task comprising running microcode at the individual device.

13. The method of claim 10, wherein the location accessed on an individual device for the preprogrammed unique identifier for the individual device comprises nonvolatile storage.

14. The method of claim 10, wherein the location accessed on an individual device for the preprogrammed unique identifier for the individual device comprises a content addressable memory.

15. The method of claim 10, wherein the unique identifier for an individual device is programmed into the location during manufacturing.

* * * * *